United States Patent
Kim et al.

(10) Patent No.: US 7,791,942 B2
(45) Date of Patent: Sep. 7, 2010

(54) METHODS OF OPERATING NONVOLATILE MEMORY DEVICES

(75) Inventors: Won-joo Kim, Hwaseong-si (KR); Tae-hee Lee, Yongin-si (KR); Jae-woong Hyun, Uijeongbu-si (KR); Yoon-dong Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 210 days.

(21) Appl. No.: 12/073,314

(22) Filed: Mar. 4, 2008

(65) Prior Publication Data
US 2009/0016107 A1 Jan. 15, 2009

(30) Foreign Application Priority Data
Jul. 13, 2007 (KR) .................... 10-2007-0070771

(51) Int. Cl.
*G11C 16/04* (2006.01)

(52) U.S. Cl. ......................... 365/185.18; 365/185.24; 365/185.26; 365/185.27

(58) Field of Classification Search ............ 365/185.18, 365/185.24, 185.26, 185.27
See application file for complete search history.

(56) References Cited

U.S. PATENT DOCUMENTS

| 6,011,715 A * | 1/2000 | Pasotti et al. ........... 365/185.03 |
| 2004/0190354 A1* | 9/2004 | Shim ......................... 365/200 |
| 2006/0139997 A1* | 6/2006 | Park et al. ................ 365/185.2 |

* cited by examiner

*Primary Examiner*—Hoai V Ho
*Assistant Examiner*—Jay Radke
(74) *Attorney, Agent, or Firm*—Harness, Dickey & Pierce, P.L.C.

(57) ABSTRACT

Methods of operating nonvolatile memory devices are provided. In a method of operating a nonvolatile memory device including a plurality of memory cells, recorded data is stabilized by inducing a boosting voltage on a channel of a memory cell in which the recorded data is recorded. The memory cell is selected from a plurality of memory cells and the boosting voltage on the channel of the selected memory cell is induced by a channel voltage of at least one memory cell connected to the selected memory cell.

25 Claims, 12 Drawing Sheets

METHODS OF OPERATING NONVOLATILE MEMORY DEVICES

PRIORITY STATEMENT

This non-provisional patent application claims priority under 35 U.S.C. §119 to Korean Patent Application No. 10-2007-0070771, filed on Jul. 13, 2007, in the Korean Intellectual Property Office, the entire contents of which is incorporated by reference.

BACKGROUND

Description of the Related Art

Conventional nonvolatile memory devices such as Electrically Erasable Programmable Read-Only Memories (EEPROMs) or flash memories may preserve data stored therein even without power. Such conventional nonvolatile memory devices may be used as storage media for mobile devices, portable memory sticks or the like.

FIG. 1 is a graph showing a variation in a threshold voltage $V_{th}$ over time during a programming operation of a conventional nonvolatile memory device. Referring to FIG. 1, conventional nonvolatile memory devices may require a relatively long time for the threshold voltage $V_{th}$ to become uniform after recording data. In one example, the threshold voltage $V_{th}$ may be reduced after recording data, and then saturated gradually. In one example, after recording data, the threshold voltage $V_{th}$ may be about 0.1V lower than a saturation voltage (e.g., about 0V in FIG. 1) after about 40 μs and about 0.01V lower than a saturation voltage after about 500 μs. Accordingly, the threshold voltage $V_{th}$ may vary during a period of time from when the data is recorded until the data is verified.

In incremental step pulse programming (ISPP), the threshold voltage variation in FIG. 1 may deteriorate the reliability of data verification, which may increase the likelihood of incorrect determinations of whether data programming is complete. Such incorrect determinations may decrease the reliability of a data programming operation.

SUMMARY

Example embodiments provide methods of operating nonvolatile memory devices for increasing operating speed of nonvolatile memory devices and/or improving reliability of programming operations.

At least one example embodiment provides a method of operating a nonvolatile memory device. The nonvolatile memory device may include a plurality of NAND type memory cells arranged between a common source line and a plurality of bit lines on a semiconductor substrate. Data may be recorded in a memory cell selected from the plurality of memory cells. The recorded data may be stabilized by inducing a boosting voltage on the channel of the selected memory cell through a channel of at least one memory cell arranged in relatively close proximity and/or connected to the selected memory cell among the plurality of memory cells. The data may then be verified.

According to at least some example embodiments, the boosting voltage may be induced by applying a pass voltage to at least one wordline coupled to the at least one memory cell arranged in relatively close proximity and/or connected to the selected memory cell. The boosting voltage may be capacitively induced from the pass voltage.

According to at least some example embodiments, the boosting voltage may be induced by applying a first voltage to the plurality of bit lines and turning on memory cells arranged between the selected memory cell and the plurality of bit lines among the plurality of memory cells. A second voltage may be applied to the common source line and turning on memory cells arranged between the selected memory cell and the common source line among the plurality of memory cells.

At least one other example embodiment provides a method of operating a NAND type nonvolatile memory device including a plurality of memory cells arranged between a common source line and a plurality of bit lines on a semiconductor substrate. In at least this example embodiment, data may be recorded in a memory cell selected from the plurality of memory cells. The selected memory cell may be turned off and a boosting voltage may be induced on the channel of the selected memory cell from the plurality of bit lines or the common source line to stabilize the recorded data. The data may be verified.

At least one other example embodiment provides a method of operating a NAND type nonvolatile memory device including a plurality of memory cells arranged between a common source line and a plurality of bit lines on a semiconductor substrate. According to at least this example embodiment, data may be recorded in a memory cell selected from the plurality of memory cells. The selected memory cell may be turned off and a boosting voltage may be capacitively induced on the channel of the selected memory cell from at least one memory cell arranged in close proximity and/or connected to the selected memory cell to stabilize the programmed data. The data may be verified.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS

Figure 1:
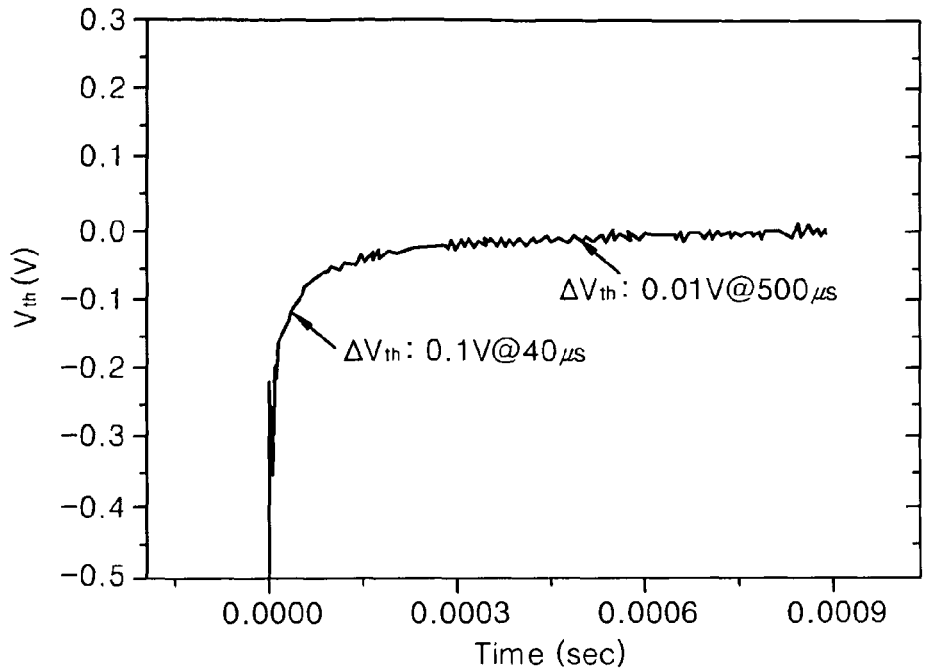
FIG. 1 is a graph showing a variation in a threshold voltage in a programming operation of a conventional nonvolatile memory device.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In at least some example embodiments, non-volatile memory devices may include devices capable of recording data using charge storage, for example, EEPROMs, flash memories or the like. As described herein, a non-volatile memory device may include a charge storage layer interposed between a semiconductor substrate and a control gate electrode. The charge storage layer may be used as a floating gate, a charge trap layer or the like.

In at least some example embodiments, example operating conditions of a non-volatile memory device are described. It will be understood that grounding the non-volatile memory device refers to applying about 0V to the non-volatile memory device.

Figure 2:
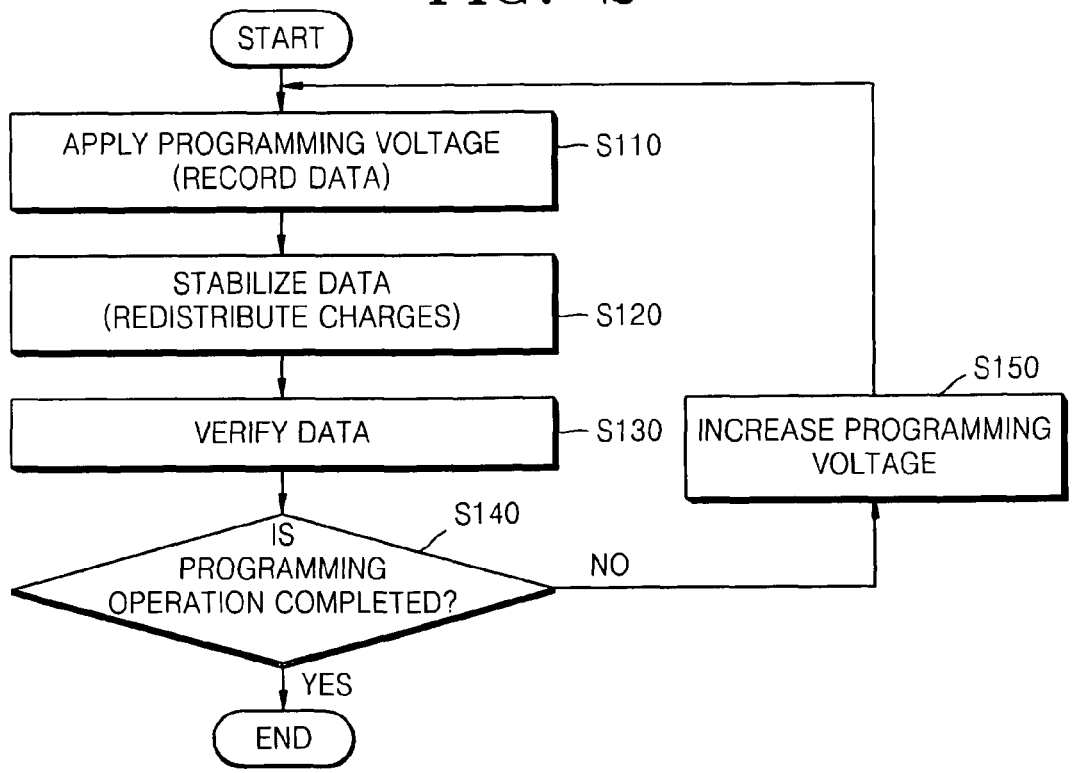
FIG. 2 is a flow chart illustrating a method of operating a nonvolatile memory device according to an example embodiment.
Figure 3:
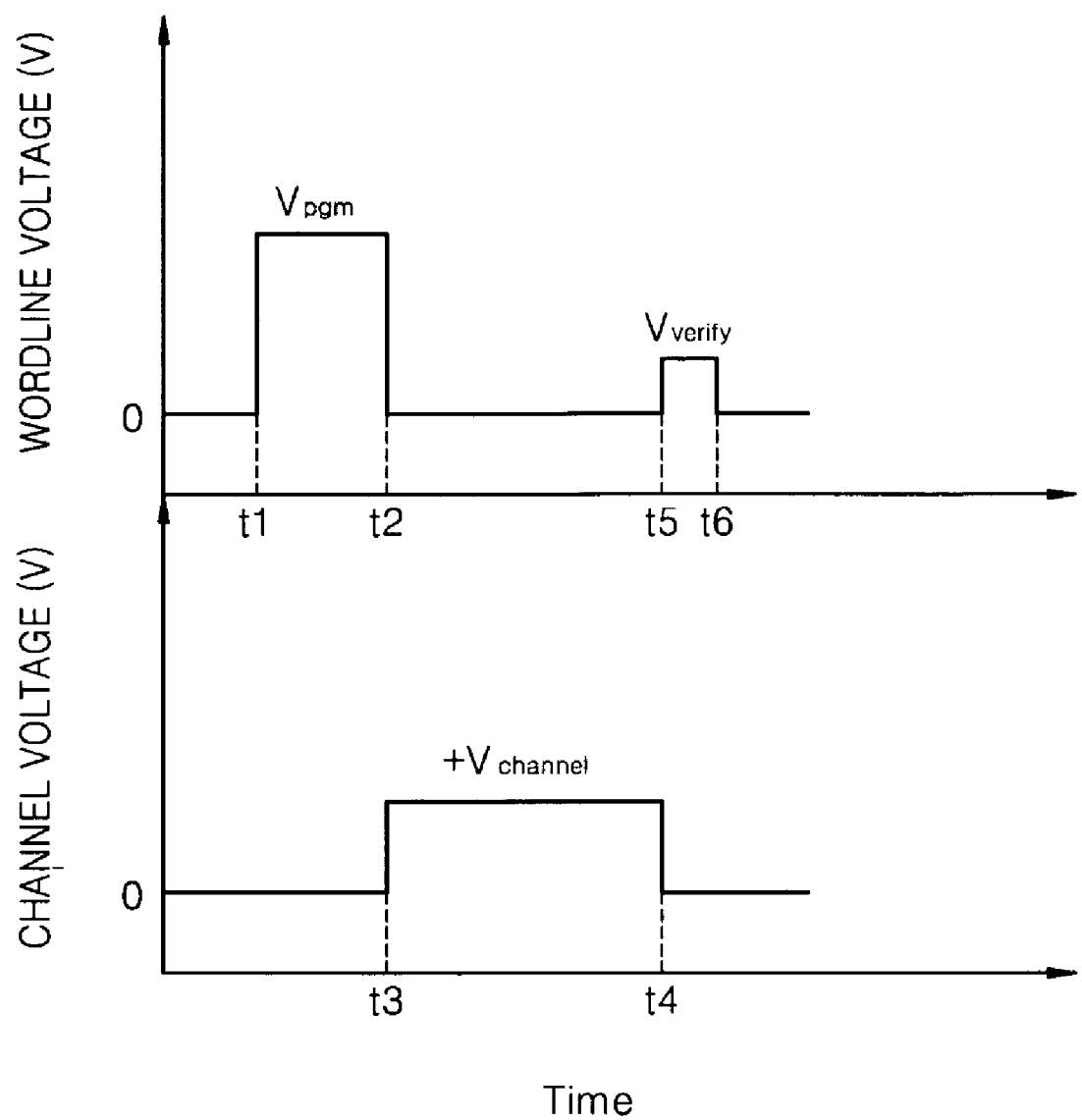
FIG. 3 is a graph showing voltage variations over time in a method of operating a nonvolatile memory device according to an example embodiment.

FIG. 2 is a flow chart illustrating a method of operating a nonvolatile memory device according to an example embodiment. FIG. 3 is a graph showing voltage variations over time in a method of operating a nonvolatile memory device according to an example embodiment.

Referring to FIG. 2, at S110 a memory cell may be selected from a plurality of memory cells in the memory device and data may be recorded in the selected memory cell by applying a programming voltage to the selected memory cell. Referring to FIG. 3, for example, data may be recorded by applying a programming voltage $V_{pgm}$ to a control gate electrode for a time between t1 to t2. The applied programming voltage may inject electrons from a semiconductor substrate into a charge storage layer using Fowler-Nordheim (FN) tunneling.

The recorded data may be stabilized at S120. For example, referring again to FIG. 3, a boosting voltage $V_{channel}$ may be applied to the selected memory cell for a time from t3 to t4 (where t3≧t2). The applied boosting voltage $V_{channel}$ may saturate the threshold voltage of the selected memory cell more rapidly. The boosting voltage $V_{channel}$ may have a polarity opposite to the polarity of a voltage set by a data recording condition, and thus, a variation induced in the selected memory cell may be more rapidly removed according to the boosting voltage $V_{channel}$.

The boosting voltage $V_{channel}$ may contribute to suppressing and/or eliminating dipole moment in a tunneling insulating layer or a blocking insulating layer formed between the control gate electrode and the semiconductor substrate. Furthermore, the boosting voltage $V_{channel}$ may more rapidly re-distribute and stabilize charges injected into the charge storage layer. Accordingly, the threshold voltage of the selected memory cell may be more rapidly saturated.

Still referring to FIG. 2, the stabilized data may be verified at S130. When verifying the stabilized data, a verification voltage $V_{verify}$ may be applied to the control gate electrode of the selected memory cell between time t5 to t6 (where t5≧t4), as illustrated in FIG. 3. A current flowing through the selected memory cell may be measured and a degree to which electrons are injected may be determined to verify a degree to which the data is recorded. Because the threshold voltage of the selected memory cell may be more uniformly saturated in a stabilization operation at S120, reliability of data verification may be improved and reliability of a data programming operation may be enhanced.

At S140, whether the programming operation is complete may be determined based on the result of a data verification operation at S130. When the programming operation is complete, the programming operation may terminate.

Referring still to S140, if the programming operation is not complete, the programming voltage may be increased at S150, and the method returns to S110. The aforementioned operations S110, S120, S130 and S140 may then be repeated.

A method of programming data while increasing the programming voltage may be referred to herein as ISPP.

The above-described example embodiment will be explained in more detail with reference to a NAND-type nonvolatile memory device. However, it will be understood that methods described herein may be applied to other nonvolatile memory devices.

Figure 4:
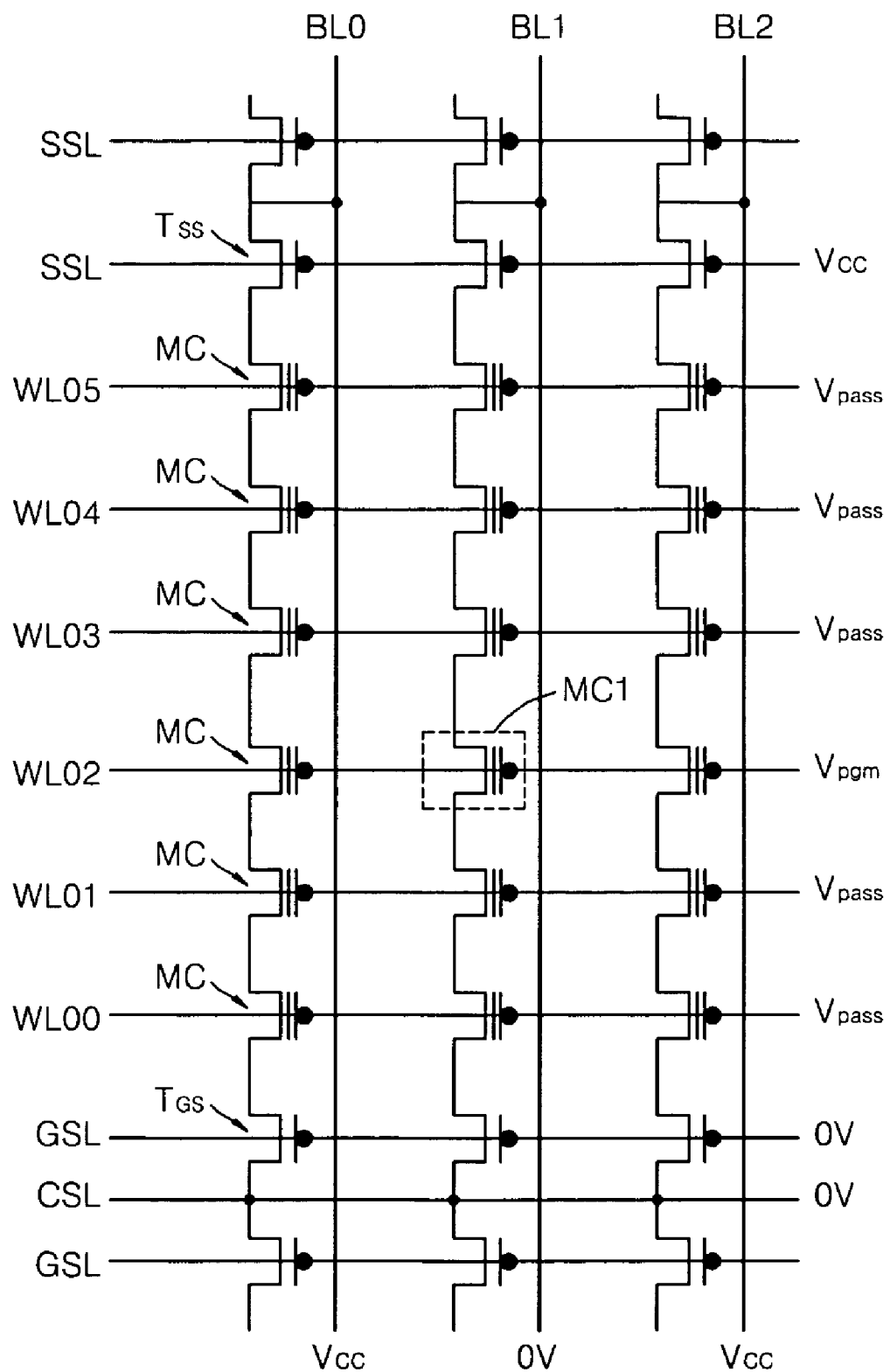
FIG. 4 is a circuit diagram illustrating a nonvolatile memory device for explaining a data recording method according to an example embodiment.

FIG. 4 is a circuit diagram of a NAND-type nonvolatile memory device for explaining a data recording method according to an example embodiment. Referring to FIG. 4, NAND-type memory cells MC may be connected between bit lines BL0, BL1 and BL2 and a common source line CSL. Wordlines WL00, WL01, WL02, WL03, WL04 and WL05 may be arranged in rows and coupled to the memory cells MC. For example, the wordlines WL00, WL01, WL02, WL03, WL04 and WL05 may be connected to control gate electrodes of the memory cells MC. The number of memory cells, the number of bit lines, and the number of wordlines may be appropriately selected and not limited to the scope of the present invention.

String select transistors $T_{SS}$ may be connected between the bit lines BL0, BL1 and BL2 and first terminals of given memory cells, for example, between the bit lines BL0, BL1 and BL2 and the wordline WL05. A string select lines SSL may be arranged in parallel with the wordlines WL00, WL01, WL02, WL03, WL04 and WL05 and coupled to the string select transistors $T_{SS}$. In each bitline, a ground select transistor $T_{GS}$ may be connected between the common source line CSL and second terminals of a given memory cell MC, for example, between the common source line CSL and a memory cell MC in the wordline WL00. A ground select line GSL may be arranged in parallel with the wordlines WL00, WL01, WL02, WL03, WL04 and WL05 and coupled to the ground select transistors $T_{GS}$.

To record data in a selected memory cell MC1, about 0V may be applied to a selected bit line BL1 coupled to the selected memory cell MC1 and an operating voltage $V_{cc}$ may be applied to unselected bit lines BL0 and BL2. The operating voltage $V_{cc}$ may be applied to the string select line SSL to turn on the string select transistors $T_{SS}$ and about 0V may be applied to the ground select line GSL and the common source line CSL. A programming voltage $V_{pgm}$ may be applied to the selected wordline WL02 coupled to the selected memory cell MC1. A pass voltage $V_{pass}$ may be applied to other wordlines WL00, WL01, WL03, WL04 and WL05.

The programming voltage $V_{pgm}$ may be induced between the channel and the control gate electrode of the selected memory cell MC1 and charge tunneling from the channel to the charge storage layer may occur. Consequently, data may be recorded in the selected memory cell MC1. The pass voltage $V_{pass}$ may be selected such that charge tunneling from the channels to the charge storage layers of unselected memory cells MC may not occur though the memory cells MC are turned on. Accordingly, the pass voltage $V_{pass}$ may be lower than the programming voltage $V_{pgm}$. The programming voltage $V_{pgm}$ and the pass voltage $V_{pass}$ may be appropriately selected according to the memory cells MC.

A boosting voltage may be induced to the channels of the memory cells MC connected to the unselected bit lines BL0 and BL2 according to the operating voltage $V_{cc}$. Accordingly, programming of the memory cells MC coupled to the selected wordline WL02 other than the selected memory cell MC1 may be suppressed and/or prevented.

The above-described data programming operation is an example and may be modified in various ways according to methods known to those of ordinary skill in the art.

Figure 5:
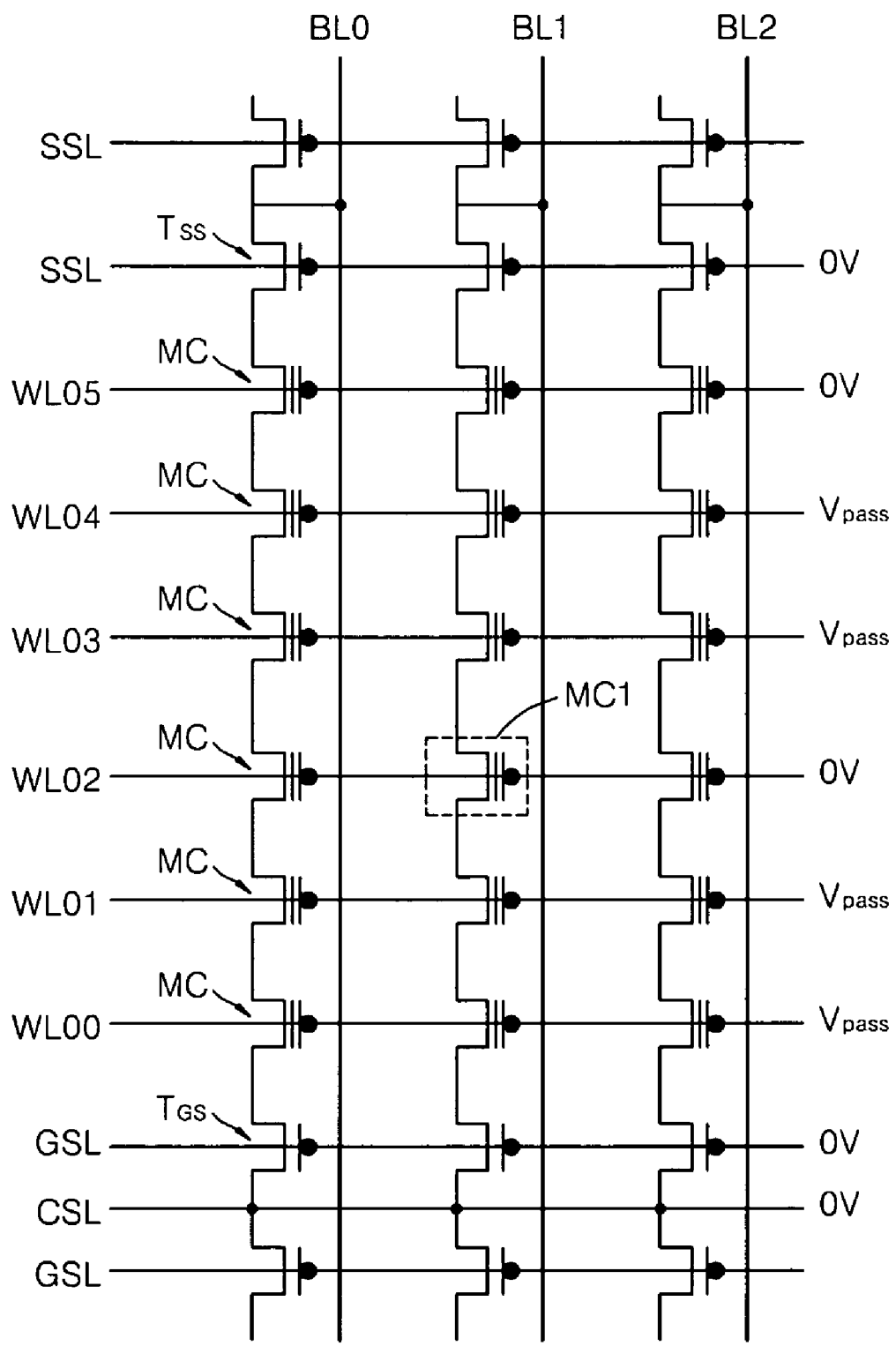
FIG. 5 is a circuit diagram illustrating a nonvolatile memory device for explaining a data stabilizing method according to an example embodiment.

FIG. 5 is a circuit diagram illustrating a nonvolatile memory device for explaining a data stabilization method according to an example embodiment.

Referring to FIG. 5, about 0V may be applied to the string select line SSL to turn off the string select transistors $T_{SS}$ and about 0V may be applied to the ground select line GSL to turn off the ground select transistors $T_{GS}$. Accordingly, the memory cells MC may float from the bit lines BL0, BL1, BL2 and the common source line CSL.

The selected memory cell MC1 may be turned off by applying about 0V to the selected wordline WL02. The pass voltage $V_{pass}$ may be applied to the wordlines WL00, WL01, WL03 and WL04 arranged at each side of the selected wordline WL02. Accordingly, channel voltages of the memory cells MC coupled to the wordlines WL00, WL01, WL03 and WL04, which are capacitively coupled with the pass voltage $V_{pass}$, may increase and a boosting voltage may be induced in the channel of the selected memory cell MC1 arranged between the memory cells MC. As described above with regard to FIG. 2, the boosting voltage may more rapidly saturate the threshold voltage of the selected memory cell MC1 to more rapidly stabilize the data recorded in the selected memory cell MC1.

Figure 6:
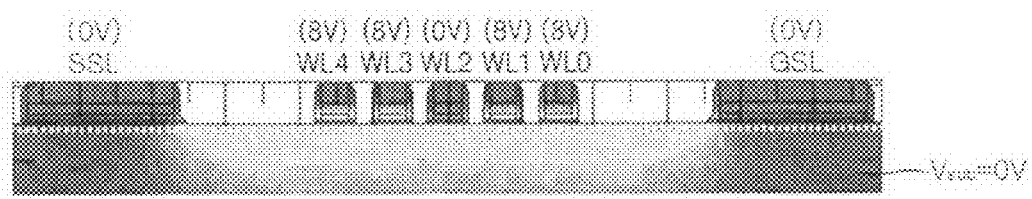
FIG. 6 is a cross-sectional view of a nonvolatile memory device during a simulation of a data stabilizing method according to an example embodiment.
Figure 7:
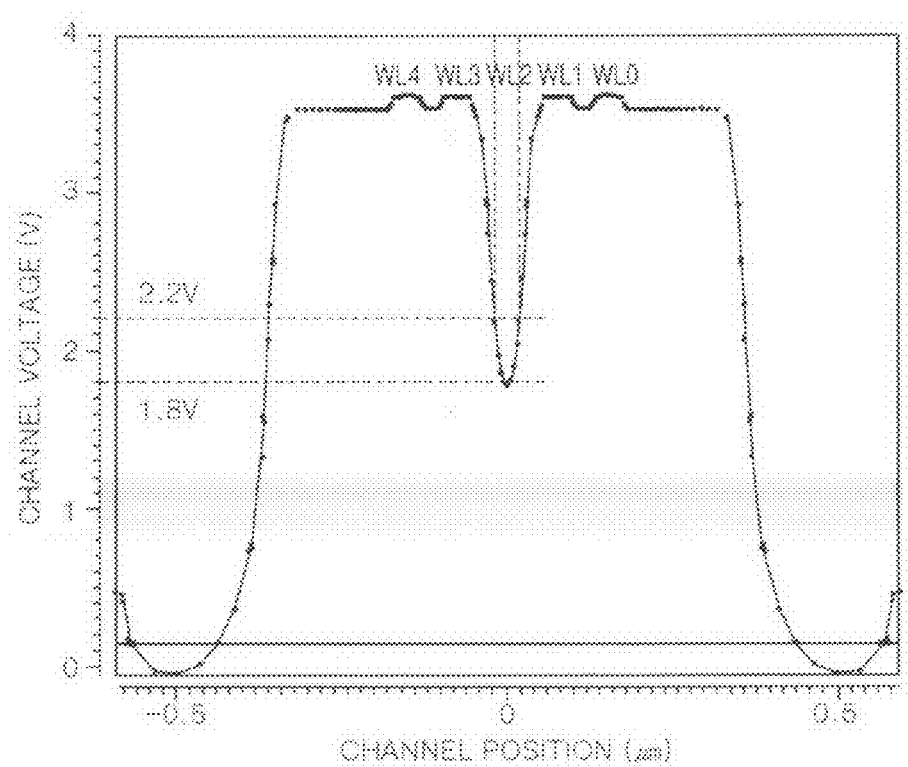
FIG. 7 is a graph showing the relationship between the channel position and the channel voltage of the nonvolatile memory device illustrated in FIG. 6.

FIG. 6 is a cross-sectional view of a nonvolatile memory device during a simulation of the data stabilizing method according to an example embodiment. FIG. 7 is a graph showing the relationship between the channel position and the channel voltage of the nonvolatile memory device illustrated in FIG. 6.

Referring to FIG. 6, about 0V may be applied to a string select line SSL and a ground select line GSL, about 0V may be applied to a selected wordline WL02, and about 8V may be applied as a pass voltage to unselected wordlines WL0, WL1, WL3 and WL4. A semiconductor substrate on which memory cells are formed may be grounded ($V_{sub}$=about 0V).

As shown in FIG. 7, approximately 3.5V may be capacitively induced in the channels of memory cells coupled to the unselected wordlines WL0, WL1, WL3 and WL4 and a boosting voltage between about 1.8V and about 2.2V, inclusive, may be induced in the channel of a memory cell coupled to the selected wordline WL2. This induction of the boosting voltage may be referred herein as local self boosting (LSB) voltage.

The LSB voltage may be generated between channels of memory cells so that the LSB voltage may occur within a relatively short period of time compared to a case in which the boosting voltage is supplied through the semiconductor substrate on which the memory cells are formed. According to example embodiments, the boosting voltage may be induced within several through hundreds of microseconds. Accordingly, the LSB voltage may be more suitable for the operation of a nonvolatile memory device requiring a relatively high operating speed.

FIGS. 8 through 13 are circuit diagrams illustrating a nonvolatile memory device for explaining a data stabilization method according other example embodiments.

Figure 8:
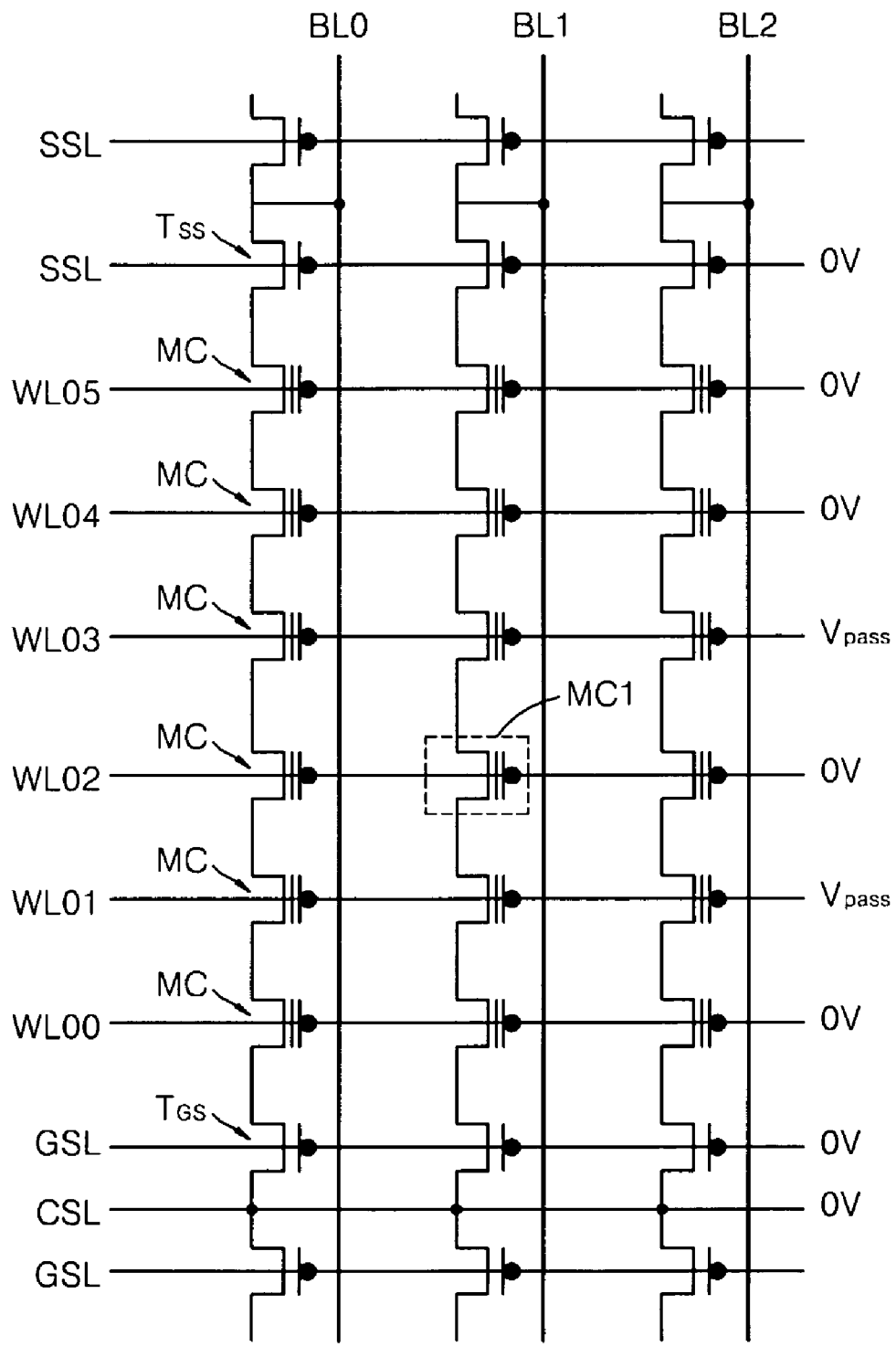
FIGS. 8 through 13 are circuit diagrams of a nonvolatile memory device for explaining a data stabilizing method according to an example embodiment.

Referring to FIG. 8, the pass voltage $V_{pass}$ may be applied to only the wordlines WL01 and WL03 arranged at respective sides of (e.g., adjacent to) the selected wordline WL02. The channel voltages of memory cells MC capacitively coupled with the pass voltage $V_{pass}$ may increase and a boosting voltage may be induced on the channel of the selected memory cell MC1 arranged among the memory cells MC.

The pass voltage $V_{pass}$ may be applied to the wordlines WL00, WL04 and WL05 in addition to the wordlines WL01 and WL03. For example, the pass voltage $V_{pass}$ may be applied to at least a pair of wordlines among the unselected wordlines WL00, WL01, WL03, WL04 and WL05 arranged at each side of the selected wordline WL02.

Figure 9:
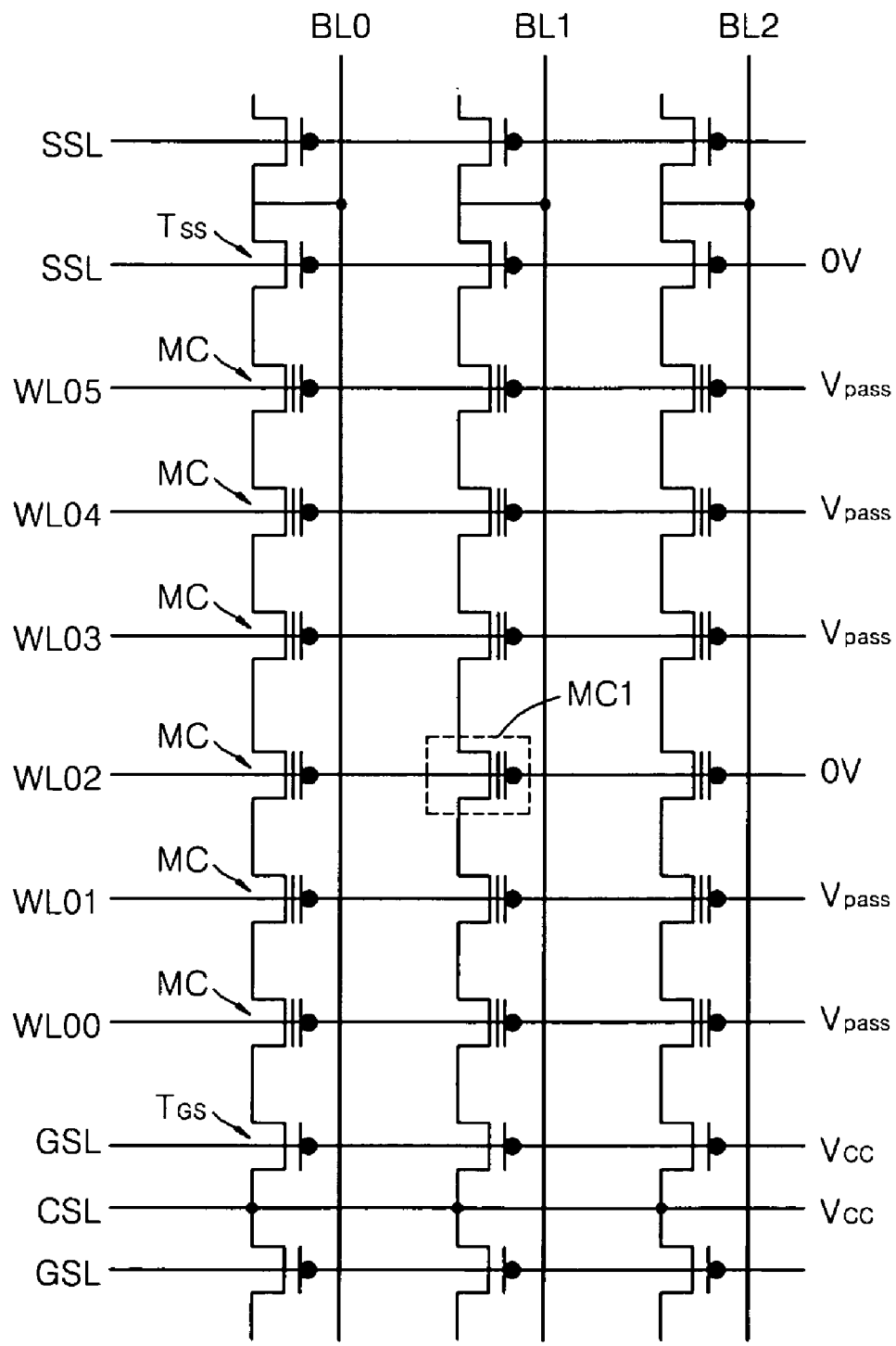

Referring to FIG. 9, the operating voltage $V_{cc}$ (referred to as a second voltage) may be applied to the common source line CSL. About 0V may be applied to the string select line SSL to turn off the string select transistors $T_{SS}$, and the operating voltage Vcc may be applied to the ground select line GSL to turn on the ground select transistors $T_{GS}$. Accordingly, the operating voltage Vcc may be transferred to the memory cells MC through the ground select transistors $T_{GS}$.

Furthermore, about 0V may be applied to the selected wordline WL02 to turn off the selected memory cell MC1 and the pass voltage $V_{pass}$ may be applied to the unselected wordlines WL00, WL01, WL03, WL04 and WL05. Accordingly, the channel voltages of memory cells MC coupled to the wordlines WL00 and WL01 may instantaneously increase and a boosting voltage may be induced on the channel of the selected memory cell MC1 located in relatively close proximity to the memory cells MC. The selected memory cell MC1 in which the boosting voltage is induced may also be characterized as being adjacent, substantially adjacent or connected to the memory cells MC in which the channel voltages increase. As described above with reference to FIG. 2, the boosting voltage may more rapidly saturate the threshold voltage of the selected memory cell MC1 to more rapidly stabilize the data recorded in the selected memory cell MC1.

The induction of the boosting voltage in the current example embodiment may be distinguished from the LSB voltage of FIG. 5 because the boosting voltage is induced from the operating voltage $V_{cc}$ applied to the common source line CSL.

The wordlines WL03, WL04 and WL05 arranged above the selected wordline WL02 may not be provided with the pass voltage $V_{pass}$ because the boosting voltage is not supplied from the bit lines BL0, BL1 and BL2.

Figure 10:
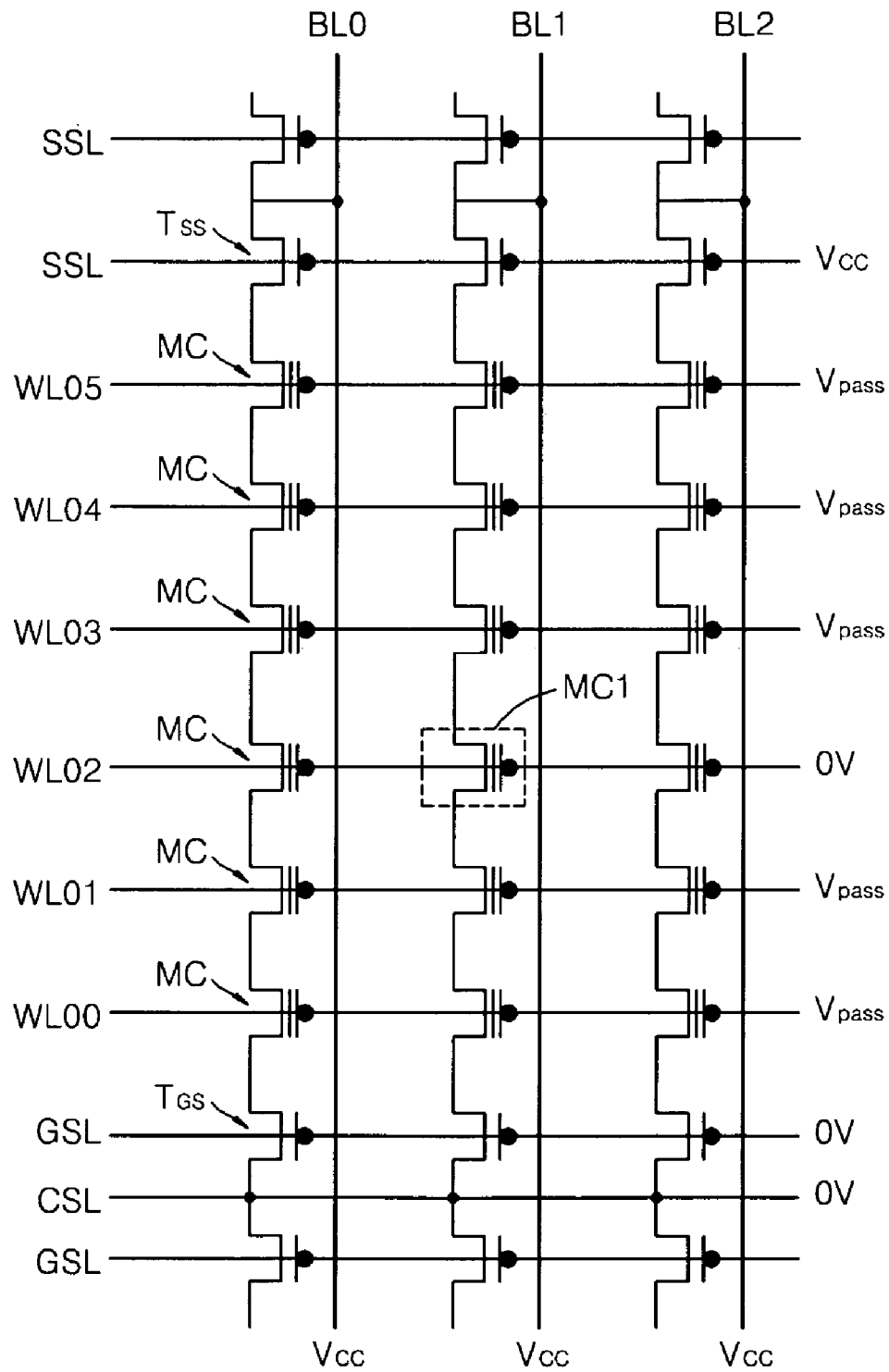

Referring to FIG. 10, the operating voltage $V_{cc}$ (referred to as a first voltage) may be applied to the bit lines BL0, BL1 and BL2. The operating voltage $V_{cc}$ may also be applied to the string select line SSL to turn on the string select transistors $T_{SS}$. About 0V may be applied to the ground select line GSL to turn off the ground select transistors $T_{GS}$. The operating voltage $V_{cc}$ may be transferred to the memory cells MC through the string select transistors $T_{SS}$.

Furthermore, about 0V may be applied to the selected wordline WL02 to turn off the selected memory cell MC1 and the pass voltage $V_{pass}$ may be applied to the unselected wordlines WL00, WL01, WL03, WL04 and WL05. Accordingly, channel voltages of memory cells MC coupled to the wordlines WL03, WL04 and WL05 may increase (e.g., instantaneously or substantially instantaneously increase) and a boosting voltage may be induced on the channel of the selected memory cell MC1 located in relatively close proximity to the memory cells MC. The selected memory cell MC1 in which the boosting voltage is induced may also be characterized as being adjacent, substantially adjacent or connected to the memory cells MC in which the channel voltages increase. As described above with regard to FIG. 2, the boosting voltage may saturate the threshold voltage of the selected memory cell MC1 more rapidly, which may more rapidly stabilize the data recorded in the selected memory cell MC1.

The current example embodiment may be distinguished from the example embodiment illustrated in FIG. 9 in that the boosting voltage may be induced from the operating voltage $V_{cc}$ applied to the bit lines BL0, BL1 and BL2.

The wordlines WL00 and WL01 arranged under or below the selected wordline WL02 may not be provided with the pass voltage $V_{pass}$ because the boosting voltage is not supplied from the common source line CSL.

Figure 11:
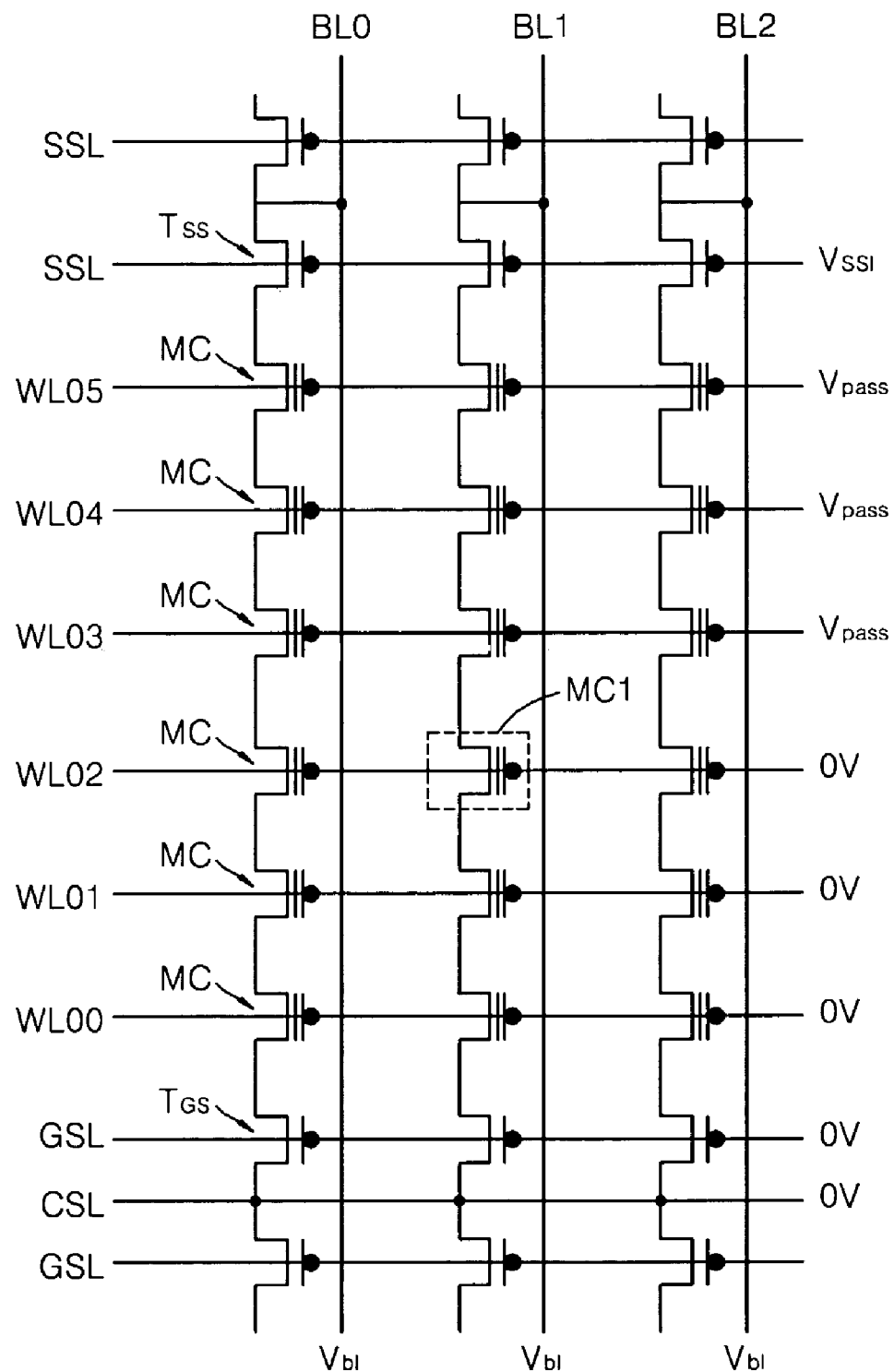

Referring to FIG. 11, a first voltage $V_{bl}$ may be applied to the bit lines BL0, BL1 and BL2. A third voltage $V_{ssl}$ may be applied to the string select line SSL to turn on the string select transistors $T_{SS}$. About 0V may be applied to the ground select line GSL to turn off the ground select transistors $T_{GS}$. The third voltage $V_{ssl}$ may be greater than or equal to the first voltage $V_{bl}$. The first voltage $V_{bl}$ may be transferred to the memory cells MC through the string select transistors $T_{SS}$.

Furthermore, about 0V may be applied to the selected wordline WL02 to turn off the selected memory cell MC1. The pass voltage $V_{pass}$ may be applied to the unselected wordlines WL03, WL04 and WL05 arranged between the string select line SSL and the selected wordline WL02. About 0V may be applied to the unselected wordlines WL00 and WL01 arranged under or below the selected wordline WL02. Accordingly, the channel voltages of memory cells MC coupled to the wordlines WL03, WL04 and WL05 may increase and a boosting voltage may be induced on the channel of the selected memory cell MC1 located in relatively close proximity to the memory cells MC. The selected memory cell MC1 in which the boosting voltage is induced may also be characterized as being located on wordline WL02, which is adjacent or substantially adjacent to wordline WL03. As described above with regard to FIG. 2, the boosting voltage may saturate the threshold voltage of the selected memory cell MC1 more rapidly, which may more rapidly stabilize the data recorded in the selected memory cell MC1.

The current example embodiment is similar to the example embodiment illustrated in FIG. 9 because the boosting voltage may be induced from the operating voltage $V_{cc}$ applied to the bit lines BL0, BL1 and BL2. However, the current example embodiment is distinguished from the example embodiment illustrated in FIG. 9 in that the first voltage $V_{bl}$ may be different from the third voltage $V_{ssl}$.

Figure 12:
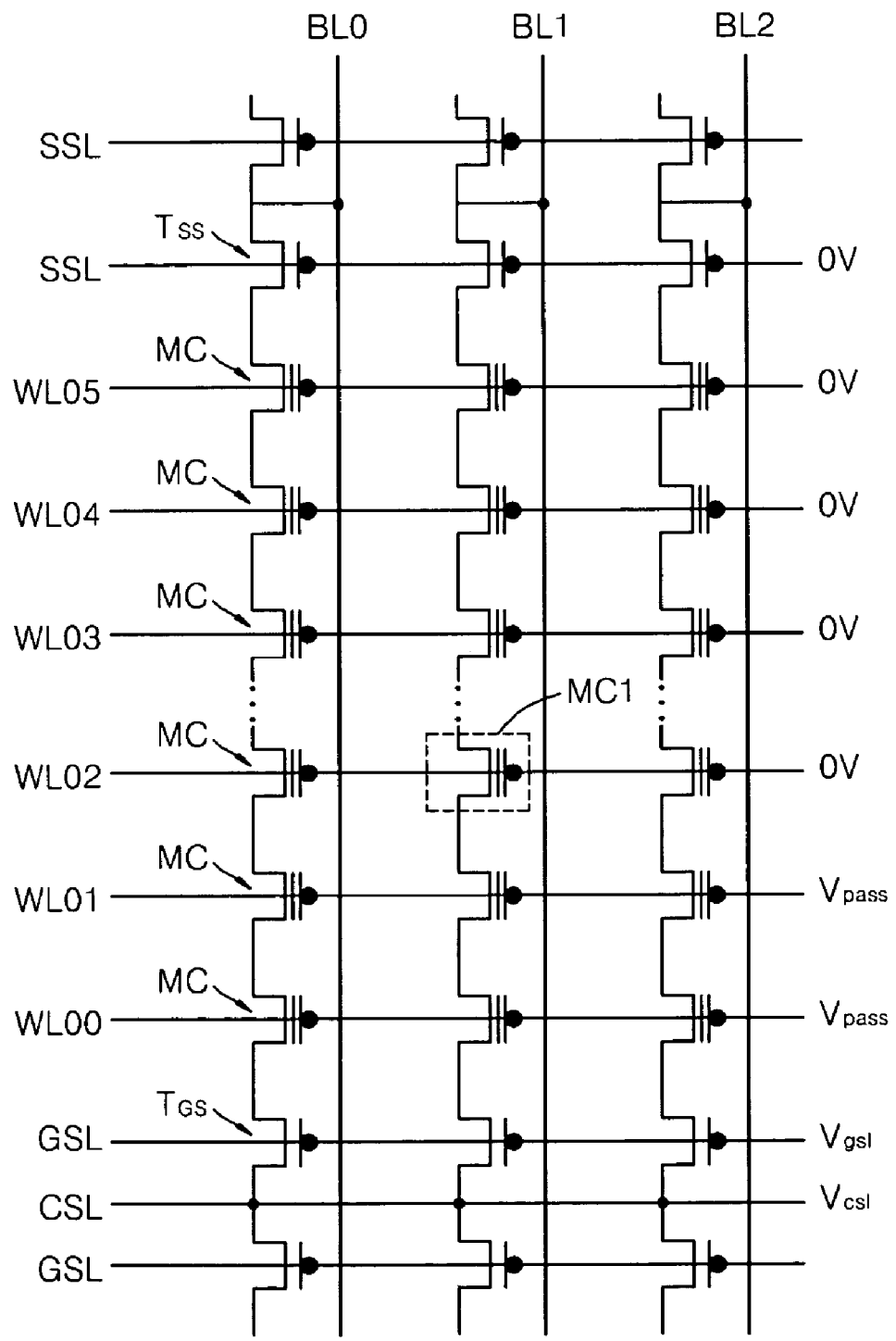

Referring to FIG. 12, a second voltage $V_{csl}$ may be applied to the common source line CSL. About 0V may be applied to the string select line SSL to turn off the string select transistors $T_{SS}$ and a fourth voltage $V_{gsl}$ may be applied to the ground select line GSL to turn on the ground select transistors $T_{GS}$. The fourth voltage $V_{gsl}$ may be greater than or equal to the second voltage $V_{csl}$. The second voltage $V_{csl}$ may be transferred to the memory cells MC through the ground select transistors $T_{GS}$.

Furthermore, about 0V may be applied to the selected wordline WL02 to turn off the selected memory cell MC1 and the pass voltage $V_{pass}$ may be applied to the unselected wordlines WL00 and WL01 arranged between the ground select line GSL and the selected wordline WL02. About 0V may be applied to the unselected wordlines WL03, WL04 and WL05 arranged above the selected wordline WL02. Accordingly, the channel voltages of memory cells MC coupled to the wordlines WL00 and WL01 may increase and a boosting voltage may be induced on the channel of the selected memory cell MC1 located in relatively close proximity to the memory cells MC. The selected memory cell MC1 in which the boosting voltage is induced may also be characterized as being adjacent, substantially adjacent or connected to the memory cells MC in which the channel voltages increase. As described above with reference to FIG. 2, the boosting voltage may more rapidly saturate the threshold voltage of the selected memory cell MC1, which may more rapidly stabilize the data recorded in the selected memory cell MC1.

The current example embodiment is similar to the example embodiment illustrated in FIG. 10 in that the boosting voltage may be induced from the common source line CSL. However, the current example embodiment may distinguish from the example embodiment illustrated in FIG. 10 because the second voltage $V_{csl}$ may be different from the fourth voltage $V_{gsl}$.

Figure 13:
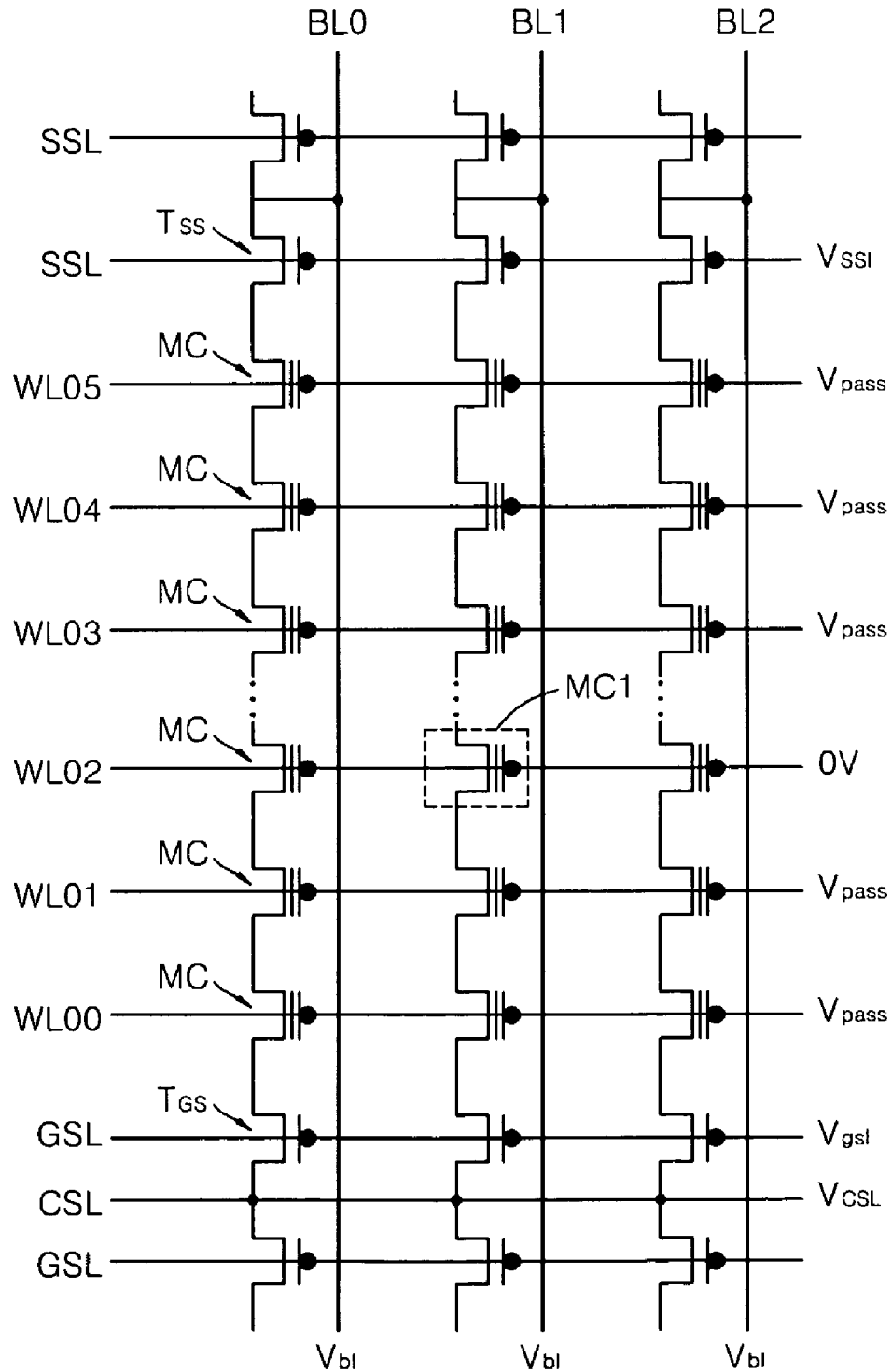

Referring to FIG. 13, first voltage $V_{bl}$ may be applied to the bit lines BL0, BL1 and BL2 and the second voltage $V_{csl}$ may be applied to the common source line CSL. The third voltage $V_{ssl}$ may be applied to the string select line SSL to turn on the string select transistors $T_{SS}$ and the fourth voltage $V_{gsl}$ may be applied to the ground select line GSL to turn on the ground select transistors $T_{GS}$. Accordingly, the first voltage $V_{bl}$ may be transferred to the memory cells MC through the string select transistors $T_{SS}$ and the second voltage $V_{csl}$ may be transferred to the memory cells MC through the ground select transistors $T_{GS}$.

Furthermore, about 0V may be applied to the selected wordline WL02 to turn off the selected memory cell MC1 and the pass voltage $V_{pass}$ may be applied to the unselected wordlines WL00, WL01, WL03, WL04 and WL05. Accordingly, the channel voltages of memory cells MC coupled to the wordlines WL00, WL01, WL03, WL04 and WL05 increase and a boosting voltage may be induced on the channel of the selected memory cell MC1 located in relatively close proximity to the memory cells MC. The selected memory cell MC1 in which the boosting voltage is induced may also be characterized as being adjacent, substantially adjacent or connected to the memory cells MC in which the channel voltages increase. As described above with reference to FIG. 2, the boosting voltage may more rapidly saturate the threshold voltage of the selected memory cell MC1, which may more rapidly stabilize the data recorded in the selected memory cell MC1.

Figure 14:
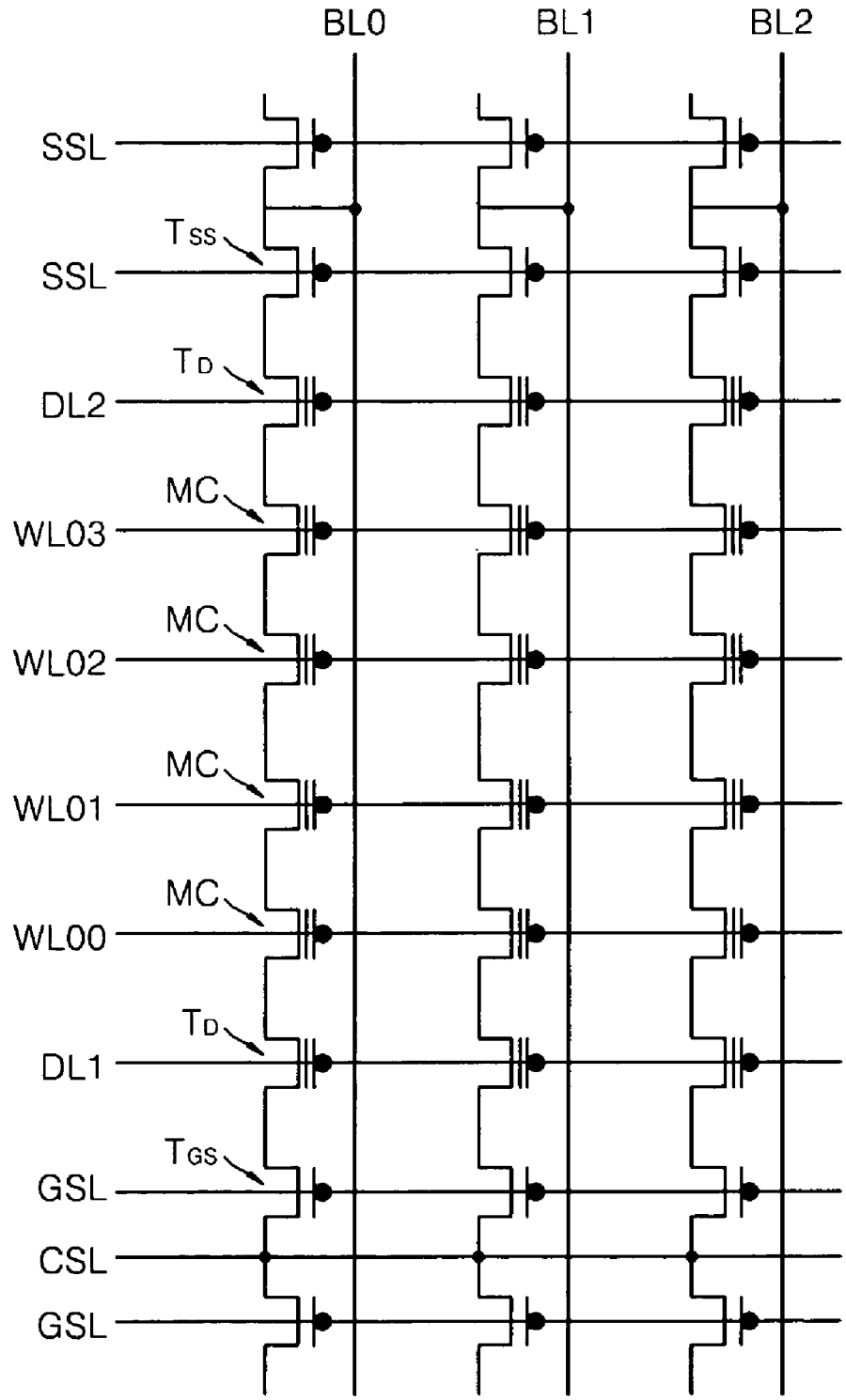
FIG. 14 is a circuit diagram of a nonvolatile memory device for explaining a method of operating a nonvolatile memory device according to another example embodiment.

FIG. 14 is a circuit diagram of the nonvolatile memory device according to another example embodiment. Referring to FIG. 14, a first dummy line DL1 may be interposed between the ground select line GSL and the wordline WL00 and a second dummy line DL2 may be interposed between the string select line SSL and the wordline WL05. The first dummy line DL1 and the second dummy line DL2 may be coupled to dummy transistors $T_D$. The dummy transistors $T_D$ may have the same or substantially the same structure as the memory cells MC, but the dummy transistors $T_D$ may not be used to record data. Instead, the dummy transistors $T_D$ may be used to select memory cells MC coupled to the wordlines WL00 and WL03 and stabilize data.

According to at least this example embodiment, when the pass voltage $V_{pass}$ is applied to the first dummy line DL1 and/or the second dummy line DL2, a boosting voltage may be provided to the memory cells MC coupled to the wordlines WL00 and WL03 more effectively. Further operation of the nonvolatile memory device illustrated in FIG. 14 is similar to that of the nonvolatile memory device illustrated in FIGS. 5 through 13, and thus, is omitted for the sake of brevity.

In methods of operating nonvolatile memory devices according to example embodiments, data recorded in a memory cell may be more rapidly stabilized by inducing a boosting voltage on the channel of the memory cell. The threshold voltage of the memory cell may be more uniformly saturated so that the reliability of data verification may improve. Accordingly, the reliability of programming data to the memory cell may be enhanced. Furthermore, the boosting voltage may be induced more rapidly within a relatively short period of time of several through hundreds microseconds. Accordingly, the method of operating a nonvolatile memory device according to example embodiments may be more suitable for nonvolatile memory devices requiring relatively high operating speeds.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A method of operating a nonvolatile memory device including a plurality of memory cells, the method comprising:
stabilizing recorded data by inducing a boosting voltage on a channel of a memory cell in which the recorded data is recorded, the memory cell being selected from a plurality of memory cells, and the boosting voltage on the channel of the selected memory cell being induced by a channel voltage of at least one memory cell connected to the selected memory cell; wherein the inducing of the boosting voltage includes,
applying a pass voltage to a wordline coupled to the at least one memory cell connected to the selected memory cell, the boosting voltage being capacitively induced from the pass voltage,
turning off string select transistors that are at a first end of the plurality of memory cells and are between a plurality of bit lines and the plurality of memory cells, and
turning off ground select transistors that are at a second end of the plurality of memory cells and are between a common source line and the plurality of memory cells, and wherein
the plurality of memory cells are arranged between the common source line and the plurality of bit lines on a semiconductor substrate.

2. The method of claim 1, wherein the stabilizing of the recorded data includes,
re-distributing charges injected into a charge storage layer of the selected memory cell.

3. The method of claim 1, wherein the stabilizing of the recorded data includes,
turning off the selected memory cell.

4. The method of claim 3, wherein the turning off of the selected memory cell includes,
grounding the wordline coupled to the selected memory cell.

5. The method of claim 1, wherein the stabilizing of the recorded data is performed within less than or equal to about 100 microseconds.

6. The method of claim 1, the stabilizing of the recorded data further includes,
grounding the semiconductor substrate.

7. The method of claim 1, wherein the turning off of the string select transistors and the ground select transistors includes,
applying about 0V to a string select line coupled to the string select transistors, and
applying about 0V to a ground select line coupled to the ground select transistors.

8. The method of claim 1, wherein the boosting voltage on the channel of the selected memory cell is induced by channel voltages of at least two memory cells, a first of the at least two memory cells being connected to a first terminal of the selected memory cell and a second of the at least two memory cells being connected to a second terminal of the selected memory cell.

9. The method of claim 1, wherein the stabilizing of the recorded data further includes, applying a first voltage to each of the plurality of bit lines, and turning on memory cells arranged between the selected memory cell and the plurality of bit lines.

10. The method of claim 9, wherein the turning on of the memory cells includes, applying the pass voltage to wordlines coupled to the memory cells arranged between the selected memory cell and the plurality of bit lines.

11. The method of claim 9, wherein the inducing of the boosting voltage further includes, turning on string select transistors connected between the plurality of bit lines and the first terminals of the plurality of memory cells.

12. The method of claim 11, wherein the turning on of the string select transistors includes, applying a second voltage to a string select line coupled to the string select transistors, the second voltage being greater than or equal to the first voltage.

13. The method of claim 1, wherein the stabilizing of the recorded data further includes, applying a second voltage to the common source line, and turning on memory cells arranged between the selected memory cell and the common source line.

14. The method of claim 13, wherein the turning on of the memory cells includes, applying the pass voltage to wordlines coupled to the memory cells arranged between the selected memory cell and the common source line.

15. The method of claim 13, wherein the stabilizing of the recorded data further includes, turning on ground select transistors connected between the common source line and second terminals of the plurality of memory cells.

16. The method of claim 15, wherein the turning on of the ground select transistors includes, applying a third voltage to a ground select line coupled to the ground select transistors, the third voltage being greater than or equal to the second voltage.

17. The method of claim 1, wherein the stabilizing of the recorded data further includes, applying a first voltage to the plurality of bit lines, applying a second voltage to the common source line, and turning on memory cells other than the selected memory cell among the plurality of memory cells.

18. The method of claim 17, wherein the stabilizing of the recorded data further includes, turning on string select transistors connected between the plurality of bit lines and first terminals of the plurality of memory cells, and turning on ground select transistors connected between the common source line and second terminals of the plurality of memory cells.

19. The method of claim 18, wherein the turning on of the string select transistors includes, applying a second voltage to a string select line coupled to the string select transistors, the second voltage being greater than or equal to the first voltage.

20. The method of claim 19, wherein the turning on of the ground select transistors includes, applying a third voltage to a ground select line coupled to the ground select transistors, the third voltage being greater than or equal to the second voltage.

21. The method of claim 1, wherein dummy transistors are connected between the common source line and the plurality of memory cells or between the plurality of bit lines and the plurality of memory cells, the stabilizing of the recorded data further including, turning on the dummy transistors.

22. The method of claim 1, further including, verifying the recorded and stabilized data.

23. The method of claim 1, further including, recording data on the selected memory cell.

24. A method of operating a nonvolatile memory device including a plurality of memory cells, the method comprising:

stabilizing recorded data by turning off a memory cell in which the recorded data is recorded and inducing a boosting voltage on a channel of the memory cell from the plurality of bit lines or the common source line, the memory cell being selected from a plurality of memory cells; wherein the inducing of the boosting voltage includes, applying a pass voltage to a wordline coupled to at least one memory cell connected to the selected memory cell, the boosting voltage being capacitively induced from the pass voltage, turning off string select transistors that are at a first end of the plurality of memory cells and are between the plurality of bit lines and the plurality of memory cells, and turning off ground select transistors that are at a second end of the plurality of memory cells and are between a common source line and the plurality of memory cells, and wherein the plurality of memory cells are arranged between the common source line and a plurality of bit lines on a semiconductor substrate.

25. The method of claim 24, further including, verifying the data.

* * * * *